(12) United States Patent
Fujita et al.

(10) Patent No.: US 10,716,247 B2
(45) Date of Patent: Jul. 14, 2020

(54) ELECTROMAGNETIC ABSORBER

(71) Applicant: Maxell Holdings, Ltd., Otokuni-gun, Kyoto (JP)

(72) Inventors: Masao Fujita, Kyoto (JP); Toshio Hiroi, Kyoto (JP)

(73) Assignee: MAXELL HOLDINGS, LTD., Kyoto (JP)

( * ) Notice: Subject to any disclaimer, the term of this patent is extended or adjusted under 35 U.S.C. 154(b) by 0 days.

(21) Appl. No.: 16/319,722

(22) PCT Filed: Jul. 19, 2017

(86) PCT No.: PCT/JP2017/026092
§ 371 (c)(1),
(2) Date: Jan. 22, 2019

(87) PCT Pub. No.: WO2018/016522
PCT Pub. Date: Jan. 25, 2018

(65) Prior Publication Data
US 2019/0269048 A1    Aug. 29, 2019

(30) Foreign Application Priority Data
Jul. 22, 2016    (JP) .................. 2016-144197

(51) Int. Cl.
*H05K 9/00*    (2006.01)
*B32B 7/025*    (2019.01)
(Continued)

(52) U.S. Cl.
CPC ............. *H05K 9/0083* (2013.01); *B32B 7/02* (2013.01); *B32B 7/023* (2019.01); *B32B 7/025* (2019.01);
(Continued)

(58) Field of Classification Search
CPC ... H05K 9/0075; H05K 9/0083; H05K 9/0088
See application file for complete search history.

(56) References Cited

U.S. PATENT DOCUMENTS

2007/0218273 A1    9/2007   Ikeda
2017/0288305 A1*   10/2017  Ohkoshi ............... H01Q 1/526

FOREIGN PATENT DOCUMENTS

JP    2000-151179 A    5/2000
JP    2001-148596 A    5/2001
(Continued)

OTHER PUBLICATIONS

Machine translation for JP 2009-188322, Radio Wave Absorber, 15 pages, translated on Sep. 25, 2019.*
(Continued)

*Primary Examiner* — Hung V Ngo
(74) *Attorney, Agent, or Firm* — Birch, Stewart, Kolasch & Birch, LLP

(57) ABSTRACT

Provided is an electromagnetic-wave absorber that can favorably absorb electromagnetic waves of a plurality of different frequencies in a high frequency band equal to or higher than the millimeter-wave band. The electromagnetic-wave absorber includes an electromagnetic-wave absorbing layer 1 in which a plurality of magnetic layers 1a-1e are stacked, each magnetic layer containing magnetic iron oxide that magnetically resonates at a high frequency in a band equal to or higher than the millimeter-wave band. A value of an anisotropic magnetic field ($H_A$) of the magnetic iron oxide contained in at least one of the magnetic layers is different from that of the magnetic iron oxide contained in another of the magnetic layers.

8 Claims, 9 Drawing Sheets

(51) Int. Cl.
  *B32B 7/023* (2019.01)
  *B32B 27/18* (2006.01)
  *H01F 1/117* (2006.01)
  *H01F 10/18* (2006.01)
  *B32B 7/02* (2019.01)
  *H01F 1/113* (2006.01)
  *H01F 1/03* (2006.01)

(52) U.S. Cl.
  CPC ............... *B32B 27/18* (2013.01); *H01F 1/03* (2013.01); *H01F 1/113* (2013.01); *H01F 1/117* (2013.01); *H01F 10/18* (2013.01); *H05K 9/00* (2013.01); *H05K 9/0071* (2013.01); *H05K 9/0075* (2013.01)

(56) References Cited

FOREIGN PATENT DOCUMENTS

| JP | 2006-80352 A | 3/2006 |
|---|---|---|
| JP | 2008-60484 A | 3/2008 |
| JP | 2009-188322 A | 8/2009 |
| JP | 2011-233834 A | 11/2011 |
| JP | 2013-201359 A | 10/2013 |
| JP | 2015-198163 A | 11/2015 |

OTHER PUBLICATIONS

Machine translation for JP 2008-060484, Radio wave absorbing material, 10 pages, translated on Sep. 24, 2019.*
Machine translation for JP 2001-148596, Electromagnetic wave absorber, 7 pages, translated on Sep. 24, 2019.*
International Search Report for PCT/JP2017/026092 (PCT/ISA/210) dated Oct. 24, 2017.
Extended European Search Report for European Application No. 17831038.9, dated Jan. 27, 2020.

* cited by examiner

ELECTROMAGNETIC ABSORBER

TECHNICAL FIELD

The present disclosure relates an electromagnetic-wave absorber that absorbs electromagnetic waves, in particular, an electromagnetic-wave absorber that can absorb electromagnetic waves of a plurality of different frequencies in a frequency band called "millimeter-wave band" between several tens of gigahertz (GHz) and several hundreds gigahertz (GHz) and in a still higher frequency band up to three terahertz (THz).

BACKGROUND ART

Mobile communications such as mobile phones, wireless LAN and electric toll collection system (ETC) utilize electromagnetic waves called "centimeter waves" having a frequency band of several gigahertz (GHz).

As electromagnetic-wave absorbing sheets for absorbing such centimeter waves, Patent Document 1 proposes a stacked sheet in which a rubber electromagnetic-wave absorbing sheet and a paper sheet material (e.g., corrugated paper) are stacked. Patent Document 2 proposes an electromagnetic-wave absorbing sheet in which thin sheets containing anisotropic graphite and a binder are stacked alternately to adjust the thickness. Thereby, the electromagnetic-wave absorbing sheet can have stable electromagnetic-wave absorbing properties, regardless of the incident direction of electromagnetic waves.

Furthermore, in order to absorb electromagnetic waves in a still higher frequency band, Patent Document 3 proposes an electromagnetic-wave absorbing sheet that can absorb electromagnetic waves in the frequency band of 20 GHz or higher, which is obtained by aligning the longitudinal direction of flat soft magnetic particles with the plane direction of the sheet.

Moreover, it is known from Patent Document 4 that an electromagnetic-wave absorber that has a packing structure of particles having epsilon iron oxide (ε-$Fe_2O_3$) crystal in the magnetic phase, exhibits electromagnetic-wave absorbing performance in a range from 25 to 100 GHz.

PRIOR ART DOCUMENTS

Patent Documents

Patent Document 1: JP 2011-233834 A
Patent Document 2: JP 2006-080352 A
Patent Document 3: JP 2015-198163 A
Patent Document 4: JP 2008-060484A

DISCLOSURE OF INVENTION

Problem to be Solved by the Invention

Recently, in order to increase the capacity of transmission data, wireless communication utilizing a frequency of 60 GHz has been projected, and as vehicle-mounted radar devices utilizing extremely narrow directivity, millimeter-wave radars having frequencies of several tens of GHz or higher (called a millimeter-wave band from 30 GHz to 300 GHz) has proceeded. Further, research on the technologies of utilizing electromagnetic waves having frequencies of terahertz (THz) order as electromagnetic waves of a high frequency band above the millimeter-wave band has proceeded.

Although electromagnetic-wave absorbers, which are one of the technologies utilizing electromagnetic waves, are essential in preventing the leakage of electromagnetic waves, electromagnetic-wave absorbers that can absorb electromagnetic waves in the entire millimeter-wave band between 30 GHz and 300 GHz, or electromagnetic waves in a still higher frequency band up to three terahertz (THz) have not yet been realized. In particular, the frequency ranges of electromagnetic waves to be absorbed by conventional electromagnetic-wave absorbers are limited. Electromagnetic-wave absorbers that can absorb electromagnetic waves of a plurality of different frequencies have not yet been realized.

Therefore, it is an object of the present disclosure to solve the above conventional problem, and provide an electromagnetic-wave absorber that can favorably absorb electromagnetic waves of a plurality of different frequencies in a high frequency band equal to or higher than the millimeter-wave band.

Means for Solving Problem

An electromagnetic-wave absorber disclosed in the present application, configured to solve the above problem, is an electromagnetic-wave absorber including an electromagnetic-wave absorbing layer in which a plurality of magnetic layers are stacked, each magnetic layer containing magnetic iron oxide that magnetically resonates in a high frequency band equal to or higher than a millimeter-wave band. A value of an anisotropic magnetic field ($H_A$) of the magnetic iron oxide contained in at least one of the magnetic layers is different from that of the magnetic iron oxide contained in another of the magnetic layers.

Effects of the Invention

In the electromagnetic-wave absorber disclosed in the present application, the value of an anisotropic magnetic field ($H_A$) of the magnetic iron oxide contained in at least one of the magnetic layers constituting the electromagnetic-wave absorbing layer is different from that of the magnetic iron oxide contained in another of the magnetic layers. Thereby, it is possible to absorb electromagnetic waves of a plurality of frequencies in a high frequency band of several tens of gigahertz (GHz) or higher.

BRIEF DESCRIPTION OF DRAWINGS

FIG. 6 shows the frequency characteristic of the permeability of magnetic iron oxide caused by gyromagnetic resonance.

DESCRIPTION OF THE INVENTION

Figure 1:
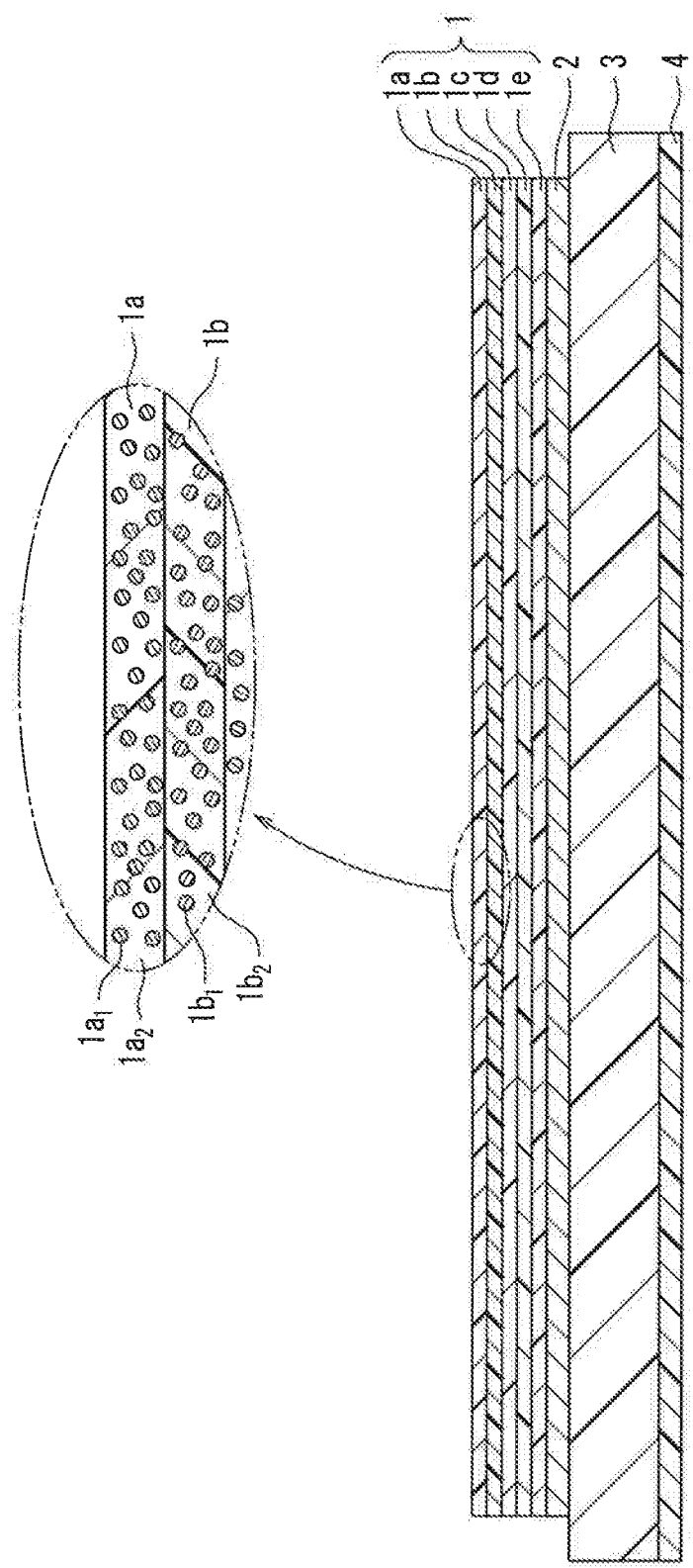
FIG. 1 is a cross-sectional view illustrating the configuration of a sheet-like electromagnetic-wave absorber of this embodiment.

In an electromagnetic-wave absorber disclosed in the present application, a plurality of magnetic layers, each containing magnetic iron oxide that magnetically resonates in a high frequency band equal to or higher than the millimeter-wave band, are stacked to configure an electromagnetic-wave absorbing layer. Further, the value of an anisotropic magnetic field ($H_A$) of the magnetic iron oxide contained in at least one of the magnetic layers is different from that of the magnetic iron oxide contained in another of the magnetic layers.

With this configuration, the electromagnetic-wave absorber disclosed in the present application can absorb electromagnetic waves of 30 GHz or higher in a high frequency band (millimeter-wave band) by the magnetic resonance of the magnetic iron oxides contained in the respective magnetic layers. Since the magnetic resonance frequencies of the magnetic iron oxides contained in the respective magnetic layers are proportional to the values of the anisotropic magnetic field ($H_A$) of the magnetic iron oxides, the magnetic layers containing the magnetic iron oxides that are different in the value of the anisotropic magnetic field can convert electromagnetic waves of different frequencies into heat and absorb them. Therefore, it is possible to provide an electromagnetic-wave absorber that can absorb a plurality of electromagnetic waves of different frequencies, which can correspond to the future use of high frequency electromagnetic waves, including millimeter-wave radars and communication at high frequencies of several tens of GHz or higher.

Incidentally, if a plurality of magnetic layers containing magnetic iron oxides having the same value of the anisotropic magnetic field ($H_A$) are stacked, the plurality of magnetic layers can be collectively regarded as one magnetic layer.

It is preferred that in the electromagnetic-wave absorber disclosed in the present application, a frequency characteristic of electromagnetic waves to be absorbed by the electromagnetic-wave absorber has a plurality of peaks, and the number of the peaks of the frequency characteristic is equal to the number of the magnetic layers stacked. With this configuration, it is possible to provide an electromagnetic-wave absorber that can absorb electromagnetic waves of a plurality of frequencies while minimizing the number of the magnetic layers to be stacked.

It is preferred that in the electromagnetic-wave absorber disclosed in the present application, an input impedance between the adjacent magnetic layers is matched, and an input impedance of the magnetic layer disposed on an uppermost surface on an electromagnetic-wave incident side is matched to an impedance in the air. With this configuration, it is possible to prevent electromagnetic waves from being undesirably reflected or scattered when electromagnetic waves enter the electromagnetic-wave absorber or travel at a boundary between the different magnetic layers. Thereby, the electromagnetic-wave absorbing properties in the magnetic layers can be maximized.

It is preferred that the input impedance of the magnetic layers gradually increases from the electromagnetic-wave incident side along a traveling direction of electromagnetic waves. With this configuration, it is possible to provide an electromagnetic-wave absorber having high electromagnetic-wave absorbing properties, where electromagnetic waves can sequentially enter the stacked magnetic layers from the magnetic layer on the electromagnetic-wave incident side.

It is preferred that the magnetic layers contain the magnetic iron oxide in a particulate form and a resin binder, and thus the electromagnetic-wave absorber is formed into a sheet having flexibility. With this configuration, it is possible to provide a sheet-like electromagnetic-wave absorber having excellent handleability.

Moreover, it is preferred that the magnetic iron oxide is epsilon iron oxide. With this configuration, it is possible to provide an electromagnetic-wave absorber that can absorb electromagnetic waves of high frequencies using epsilon iron oxides having high magnetic resonance frequencies.

Further, it is preferred that a reflective layer made of a metal plate, a metal foil or a metal-deposited film, is stacked on a surface of the electromagnetic-wave absorbing layer that is not on the electromagnetic-wave incident side. With this configuration, it is possible to provide an electromagnetic-wave absorber that can reliably shield and absorb electromagnetic waves in a frequency band equal to or higher than the millimeter-wave band.

In this case, it is preferred that the reflective layer and the electromagnetic-wave absorbing layer are stacked sequentially on a resin base, and an adhesive layer is formed on a surface of the resin base on a side opposite to a side where the electromagnetic-wave absorbing layer is disposed. With this configuration, it is possible to provide an electromagnetic-wave absorber having excellent handleability Hereinafter, the electromagnetic-wave absorber disclosed in the present application will be described with reference to the drawings.

In a broader sense, the term "electric waves" can be understood as one type of electromagnetic waves, and therefore the present specification uses the term "electromagnetic waves". For example, electric-wave absorbers are called electromagnetic-wave absorbers in the present specification.

Embodiment 1

An electromagnetic-wave absorber of Embodiment 1 disclosed in the present application is an electromagnetic-wave absorber formed as an electromagnetic-wave absorbing sheet having flexibility as a whole, in which each of magnetic layers containing particulate magnetic iron oxide and a resin binder is formed into a sheet.

[Sheet Configuration]

FIG. 1 is a cross-sectional view illustrating the configuration of the electromagnetic-wave absorbing sheet as the electromagnetic-wave absorber of this embodiment.

FIG. 1 is illustrated for the sake of easy understanding of the configuration of the electromagnetic-wave absorbing sheet of this embodiment, and does not faithfully reflect the actual sizes or thicknesses of members illustrated therein.

The electromagnetic-wave absorbing sheet exemplified in this embodiment includes an electromagnetic-wave absorbing layer 1 in which five magnetic layers 1a, 1b, 1c, 1d and 1e each containing magnetic iron oxide are stacked. In the magnetic layers 1a, 1b, 1c, 1d and 1e constituting the electromagnetic-wave absorbing layer 1, magnetic iron oxide particles ($1a_1$, $1b_1$) are dispersed in a resin binder ($1a_2$, $1b_2$) as illustrated in a partial enlarged view of the magnetic layers 1a and 1b in FIG. 1.

In the electromagnetic-wave absorbing sheet of this embodiment illustrated in FIG. 1, the values of the anisotropic magnetic field ($H_A$) of the respective magnetic iron oxides contained the five magnetic layers constituting the electromagnetic-wave absorbing layer 1 are all different. By doing so, in the electromagnetic-wave absorbing sheet of this embodiment, the five magnetic layers can absorb electromagnetic waves of their predetermined frequencies. Thus, the electromagnetic-wave absorbing sheet as a whole can have electromagnetic-wave absorbing properties of forming electromagnetic wave absorption peaks at five different frequencies. Incidentally, in the electromagnetic-wave absorbing sheet of this embodiment, it is not essential in the electromagnetic-wave absorber disclosed in the present application that the values of the anisotropic magnetic field ($H_A$) of the magnetic iron oxides contained in the magnetic layers constituting the electromagnetic-wave absorbing layer 1 are all different. By differentiating the value of the anisotropic magnetic field ($H_A$) of the magnetic iron oxide contained in at least one of the magnetic layers from that of the magnetic iron oxide contained in another of the magnetic layers, i.e., by stacking magnetic layers containing magnetic iron oxides having at least two different values of the anisotropic magnetic field ($H_A$), it is possible to obtain an electromagnetic-wave absorbing sheet having electromagnetic-wave absorbing properties having peaks at a plurality of frequencies.

The electromagnetic-wave absorbing layer in which a plurality of the magnetic layers are stacked may have a configuration in which the magnetic layers are stacked directly in contact with each other, or a configuration in which an adhesive layer is interposed between the magnetic layers. In the case of interposing an adhesive layer between the magnetic layers, it is preferred that the thickness of the adhesive layer is about 20 to 100 μm. When the adhesive layer is thinner than 20 μm, the adhesive strength between the layers becomes weak, and the layers are easily peeled off or displaced. When the adhesive layer is thicker than 100 μm, the thickness of a plurality of the magnetic layers as a whole increases, which tends to lower the flexibility of the electromagnetic-wave absorbing sheet as a whole. By setting the thickness of the adhesive layer within a range from 20 to 100 μm, it is possible to provide an electromagnetic-wave absorbing sheet having flexibility in which a plurality of the magnetic layers are adhered favorably.

The material of the adhesive layer may be a known material used as an adhesive layer such as an adhesive tape, including an acrylic-based adhesive, a rubber-based adhesive, and a silicone-based adhesive. The adhesive strength is preferably 5 N/10 mm to 12 N/10 mm. When the adhesive strength is less than 5 N/10 mm, the layers may be easily peeled off or displaced. When the adhesive strength is larger than 12 N/10 mm, the layers are difficult to be peeled off.

If magnetic layers containing magnetic iron oxides having the same value of the anisotropic magnetic field ($H_A$) are stacked directly or stacked via an adhesive layer, the stack will absorb electromagnetic waves of one frequency, and thus can be regarded as one magnetic layer.

Figure 2:
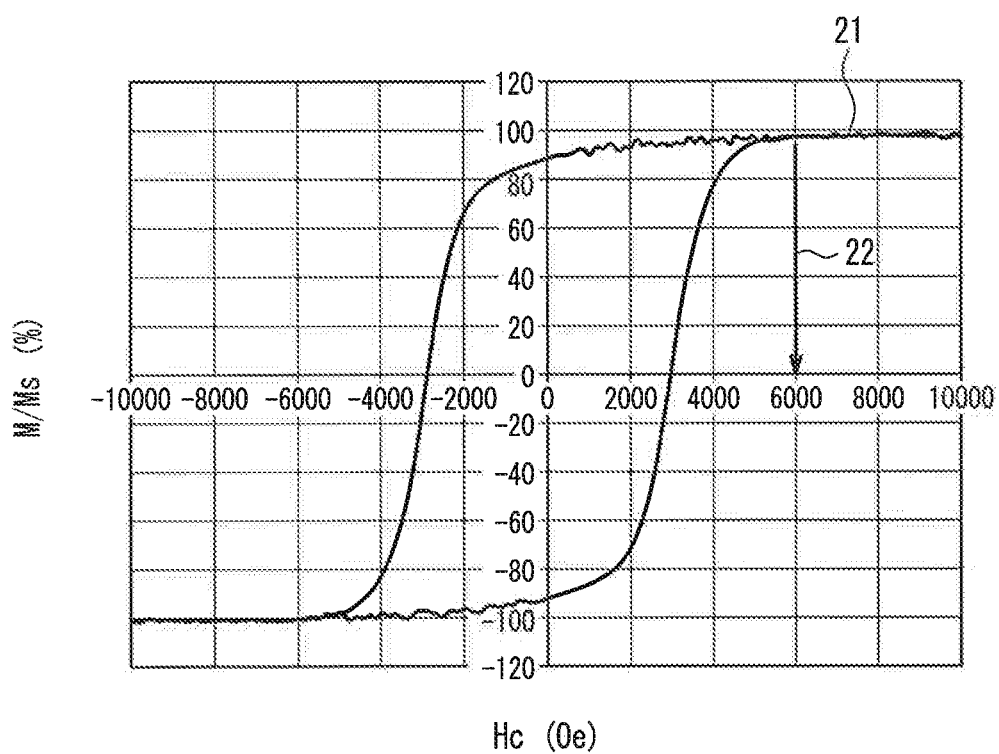
FIG. 2 shows the magnetic properties of magnetic iron oxide with respect to external magnetization to explain the value of the anisotropic magnetic field ($H_A$) of magnetic iron oxide.

FIG. 2 illustrates the magnetization curve of the magnetic iron oxide.

A magnetization curve 21, which indicates the intensity of magnetization remaining in the magnetic iron oxide upon application of the magnetic field from the outside while changing the intensity, shows a hysteresis curve as illustrated in FIG. 2. Since the magnetic iron oxide that magnetically resonates in the millimeter-wave band, i.e., a high frequency band of several tens of GHz to several hundreds GHz (frequencies of electromagnetic waves having wavelength in millimeters) and a still higher frequency band up to 3 terahertz, is a gyromagnetic resonant-type magnetic material, the hysteresis curve of the magnetic iron oxide is obliquely inclined. At this time, the value of the applied magnetic field indicated by an arrow 22 in FIG. 2, at which the magnetization curve in a hard axis direction reaches a saturation magnetic field, is a value of the anisotropic magnetic field ($H_A$) of the magnetic iron oxide. This value indicates the intensity of the applied magnetic field where spins are aligned in one direction.

The value of the anisotropic magnetic field ($H_A$) and a natural magnetic resonance frequency fr of the magnetic material has a relationship expressed by Formula (1) below.

$$fr = v/2\pi a * H_A \quad (1)$$

Here, v is a gyromagnetic constant determined by the type of the magnetic material.

Thus, in the gyromagnetic resonant-type magnetic material, there is a proportional relationship between the value of the anisotropic magnetic field ($H_A$) and the natural magnetic resonance frequency fr. In the electromagnetic-wave absorbing layer 1 of this embodiment, the magnetic layers 1a, 1b, 1c, 1d and 1e that are different in the value of the anisotropic magnetic field ($H_A$) magnetically resonate at different frequencies, thereby converting electromagnetic waves of their frequencies into heat and attenuating them. As a result, in the electromagnetic-wave absorbing sheet of this embodiment, the respective magnetic layers can absorb electromagnetic waves of their predetermined frequencies, and the stack of the magnetic layers can absorb electromagnetic waves of a plurality of frequencies.

The electromagnetic-wave absorbing sheet of this embodiment illustrated in FIG. 1 is a reflection-type electromagnetic-wave absorbing sheet in which a reflective layer 2 made of a metal material is formed on the back surface side (lower side in FIG. 1) of the electromagnetic-wave absorbing layer 1, and a stack of the electromagnetic-wave absorbing layer 1 and the reflective layer 2 is disposed on a base film 3 (resin base). An adhesive layer 4 is formed on the base film 3 on a side (lower side in FIG. 1) opposite to the side (upper side in FIG. 1) where the electromagnetic-wave absorbing layer 1 is disposed.

The electromagnetic-wave absorbing sheet of this embodiment is configured so that the magnetic iron oxides contained in the electromagnetic-wave absorbing layer 1 resonate magnetically, thereby converting electromagnetic waves into heat energy by magnetic loss and absorbing electromagnetic waves. Thus, the electromagnetic-wave absorbing layer 1 can absorb electromagnetic waves independently. Therefore, the electromagnetic-wave absorbing sheet may be a transmission-type that includes only the electromagnetic-wave absorbing layer 1 to absorb electromagnetic waves passing therethrough. The electromagnetic-wave absorbing sheet of this embodiment also may be configured to include the electromagnetic-wave absorbing layer 1 and the reflective layer 2 (metal layer), wherein electromagnetic waves are incident upon the electromagnetic-wave absorbing layer 1 from one side of the electromagnetic-wave absorbing layer 1, and the reflective layer 2 is disposed on the other side of the electromagnetic-wave absorbing layer 1, i.e., on the back surface side relative to the electromagnetic-wave incident side. With this configuration, electromagnetic waves incident upon the electromagnetic-wave absorbing layer 1 are reliably shielded, while the intensity of electromagnetic waves to be emitted as reflected waves can be reduced by the absorption of electromagnetic waves by the electromagnetic-wave absorbing layer 1.

As described later, in the electromagnetic-wave absorbing sheet of this embodiment, impedance matching is performed by adjusting the thickness of the electromagnetic-wave absorbing layer 1 based on the frequencies of electromagnetic waves to be absorbed, so as to allow the electromagnetic-wave absorbing layer 1 to absorb electromagnetic waves of different frequencies more reliably. For example, in the case of an electromagnetic-wave absorbing sheet that absorbs electromagnetic waves of 75 GHz, the magnetic layer will be a thin sheet having a thickness of 1 mm or less. Because of this, even if a plurality of such thin magnetic layers are stacked, the electromagnetic-wave absorbing layer will be still thin. To cope with this, by stacking the base film 3 (resin base) having a predetermined thickness on the electromagnetic-wave absorbing layer or on the stack of the electromagnetic-wave absorbing layer and the reflective layer instead of using them as they are as the electromagnetic-wave absorbing sheet, the handleability as the electromagnetic-wave absorbing sheet improves.

Moreover, in many cases, the electromagnetic-wave absorbing sheet of this embodiment is attached to the surface of a member located around a generation source of high frequency electromagnetic waves. The handleability of the electromagnetic-wave absorbing sheet further improves by stacking the adhesive layer 4 on the base film 3.

[Magnetic Iron Oxide]

In the electromagnetic-wave absorbing sheet of this embodiment, epsilon iron oxide is used as the particulate magnetic iron oxide.

Epsilon iron oxide ($\varepsilon\text{-Fe}_2\text{O}_3$) is a phase that appears between the alpha phase ($\alpha\text{-Fe}_2\text{O}_3$) and the gamma phase ($\gamma\text{-Fe}_2\text{O}_3$) in ferric oxide ($\text{Fe}_2\text{O}_3$), and is a magnetic material that can be obtained in a single phase state by a nanoparticle synthesis method combining a reverse micelle method and a sol-gel method.

Epsilon iron oxide, which is a fine particle of several nm to several tens of nm, has the largest coercive force among metal oxides of about 20 kOe at room temperature; besides, natural resonance by a gyromagnetic effect based on the precession is caused at a frequency band of several tens of GHz or higher (millimeter-wave band). Therefore, epsilon iron oxide can be used as the electromagnetic-wave absorbing material that absorbs electromagnetic waves of the millimeter-wave band.

Further, in epsilon iron oxide, by substituting part of the Fe site of the crystal with a trivalent metal element such as aluminum (Al), gallium (Ga), rhodium (Rh) or indium (In), it is possible to change a magnetic resonance frequency, i.e., a frequency of electromagnetic waves to be absorbed when epsilon iron oxide is used as the electromagnetic-wave absorbing material.

Figure 3:
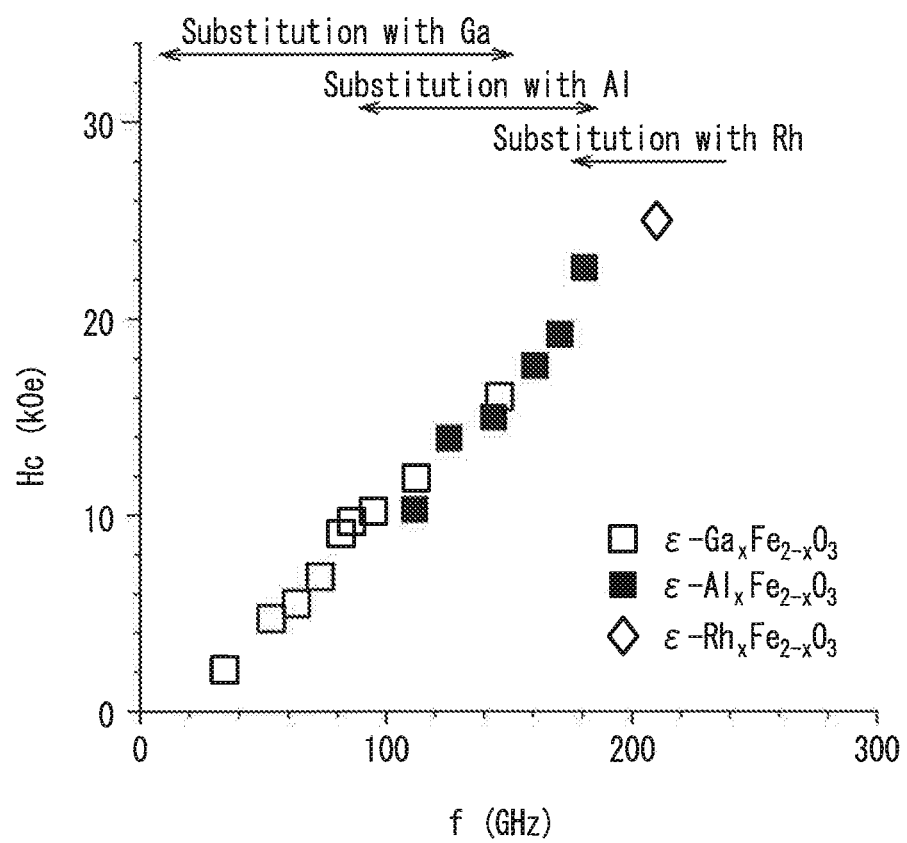
FIG. 3 illustrates the electric-wave absorbing properties of epsilon iron oxide in which part of the Fe site is substituted.

FIG. 3 shows a relationship between a coercive force Hc of epsilon iron oxide and a natural resonance frequency f when the metal element substituting for the Fe site is changed. The natural resonance frequency f coincides with the frequency of electromagnetic waves to be absorbed.

FIG. 3 indicates that epsilon iron oxides in which part of the Fe site is substituted have different natural resonance frequencies depending on the type of the substituted metal element and the substitution amount. Moreover, the coercive force of epsilon iron oxide increases in keeping with the natural resonance frequency.

More specifically, epsilon iron oxide substituted with gallium ($\varepsilon\text{-Ga}_x\text{Fe}_{2-x}\text{O}_3$) has an absorption peak in a frequency band from about 30 GHz to 150 GHz by adjusting the substitution amount "x". Epsilon iron oxide substituted with aluminum ($\varepsilon\text{-Al}_x\text{Fe}_{2-x}\text{O}_3$) has an absorption peak in a frequency band from about 100 GHz to 190 GHz by adjusting the substitution amount "x". Therefore, the frequency of electromagnetic waves to be absorbed can be set to a desired value by selecting the type of the element substituting for the Fe site of epsilon iron oxide and adjusting the substitution amount of Fe to achieve the natural resonance frequency of the frequency to be absorbed by the electromagnetic-wave absorbing sheet. Further, in the case of using epsilon iron oxide substituted with rhodium ($\varepsilon\text{-Rh}_x\text{Fe}_{2-x}\text{O}_3$), it is possible to shift a frequency band of electromagnetic waves to be absorbed to a still higher direction of 180 GHz or higher.

Epsilon iron oxides can be purchased, including epsilon iron oxides in which part of the Fe site is substituted with metal. Epsilon iron oxide can be obtained as particles having an average particle diameter of about 30 nm and having a substantially spherical shape or short rod shape (bar shape).

[Magnetic Layer]

In the electromagnetic-wave absorbing sheet of this embodiment, the respective magnetic layers constituting the electromagnetic-wave absorbing layer 1 are configured so that the above-described magnetic iron oxide particles are dispersed in a resin binder. Thus, the electromagnetic-wave absorbing sheet has flexibility as a sheet.

The resin binder to be used in the magnetic layers may be a resin material such as epoxy-based resin, polyester-based resin, polyurethane-based resin, acrylic-based resin, phenol-based resin, melamine-based resin, or rubber-based resin.

More specifically, the epoxy-based resin may be a compound obtained by epoxidizing hydroxyl groups at both terminals of bisphenol A. The polyurethane-based resin may be, e.g., polyester-based urethane resin, polyether-based urethane resin, polycarbonate-based urethane resin, or epoxy-based urethane resin. The acrylic-based resin may be a functional group-containing methacrylic polymer that is obtained by copolymerizing: alkyl acrylate and/or alkyl methacrylate that is methacrylic-based resin and that has 2 to 18 carbon atoms in the alkyl group; a functional group-containing monomer; and as needed other modifying monomers copolymerizable therewith.

The rubber-based resin to be used as the binder may be, e.g., a rubber-based material such as SIS (styrene-isoprene block copolymer) or SBS (styrene-butadiene block copolymer) which is a styrene-based thermoplastic elastomer, EPDM (ethylene-propylene-diene-rubber) which is a petroleum synthetic rubber, acrylic rubber, or silicone rubber.

From the viewpoint of environment, it is preferred that the resin to be used as the binder does not contain halogen, i.e., halogen free. These resin materials are used in general as binder materials for resin sheets, and can be obtained easily.

The expressions "flexible" and "flexibility" in this specification refer to a state in which the magnetic layer and the electromagnetic-wave absorbing layer in which a plurality of the magnetic layers are stacked can be bent to a certain degree. In other words, when the sheet is rolled up and then the bent state is released, plastic deformation such as breakage does not occur, and the sheet returns to a flat state.

The respective magnetic layers of the electromagnetic-wave absorbing sheet of this embodiment contain epsilon iron oxide as the electromagnetic-wave absorbing material. Since epsilon iron oxide is a fine nanoparticle having a particle diameter of several nm to several tens of nm as described above, it is important to favorably disperse the nanoparticles in the binder during the formation of the magnetic layers. Because of this, the respective magnetic layers constituting the electromagnetic-wave absorbing layer contain a phosphate compound. Examples of the phosphate compound include: allyl sulfonic acids such as phenylphosphonic acid and phenylphosphonic dichloride; alkylphosphonic acids such as methylphosphonic acid, ethylphosphonic acid, octylphosphonic acid, propylphosphonic acid; and polyfunctional phosphonic acids such as hydroxyethanediphosphonic acid, nitrotris methylene phosphonic acid. These phosphate compounds are flame-retardant and function as dispersants for fine magnetic iron oxide powder, thereby favorably dispersing epsilon iron oxide particles in the binder.

More specifically, as the dispersant, phenylphosphonic acid (PPA) manufactured by FUJIFILM Wako Pure Chemical Corporation or Nissan Chemical Corporation and an oxidized phosphoric acid ester "JP-502" (trade name) manufactured by JOHOKU CHEMICAL CO., LTD., can be used.

In one example, the composition of the magnetic layer may be 2 to 50 parts of the resin binder and 0.1 to 15 parts of the phosphate compound based on 100 parts of epsilon iron oxide powder. When the content of the resin binder is less than 2 parts, magnetic iron oxide cannot be dispersed favorably, and the shape of the magnetic layer cannot be maintained as a sheet. When the content of the resin binder exceeds 50 parts, the volume content of the magnetic iron oxide in the magnetic layer is lowered and the permeability decreases, which lessens the electromagnetic-wave absorption effects.

When the content of the phosphate compound is less than 0.1 parts, magnetic iron oxide cannot be dispersed favorably using the resin binder. When the content of the phosphate compound exceeds 15 parts, the effect of favorably dispersing magnetic iron oxide becomes saturated. The volume content of the magnetic iron oxide in the magnetic layer is lowered and the permeability decreases, which lessens the electromagnetic-wave absorption effects.

The magnetic layer can be formed, for example, by preparing a magnetic coating material that contains at least magnetic iron oxide powder and a resin binder, and applying the magnetic coating material in a predetermined thickness, followed by drying and calendering. The magnetic coating material can be prepared also by mixing at high speed at least magnetic iron oxide powder, a phosphate compound (dispersant) and a resin binder as magnetic coating material components with a high-speed stirrer to prepare a mixture, and dispersing the obtained mixture with a sand mill.

In this manner, for example, by forming a plurality of the magnetic layers constituting the electromagnetic-wave absorbing layer on a peelable sheet, which allows the magnetic layers after drying and calendering to be peeled off easily by silicone-coating or the like, and stacking the magnetic layers that are peeled off from the peelable sheet, it is possible to form an electromagnetic-wave absorbing layer in which a plurality of the magnetic layers each containing desired magnetic iron oxide are stacked. Further, by stacking the magnetic layers sequentially using a die coater, a roll coater, a table coater or the like and calendering the stack of the magnetic layers all together, it is possible to increase the productivity of the electromagnetic-wave absorbing layer in which the magnetic layers are stacked.

In the electromagnetic-wave absorbing sheet of this embodiment, the thickness of the respective magnetic layers constituting the electromagnetic-wave absorbing layer largely affects electromagnetic-wave absorbing properties. The thickness of the magnetic layers will be detailed later.

[Reflective Layer]

The electromagnetic-wave absorbingسheet of this embodiment includes the reflective layer 2 on the back surface side of the electromagnetic-wave absorbing layer 1 in which the magnetic layers are stacked as illustrated in FIG. 1, i.e., on a surface of the electromagnetic-wave absorbing layer 1 on a side opposite to the electromagnetic-wave incident side.

Any metal layer that is formed in close contact with the back surface of the electromagnetic-wave absorbing layer 1 (the surface thereof on the lower side in FIG. 1) may be used as the reflective layer 2. Specifically, the reflective layer 2 may be a metal plate disposed in close contact with the surface of the magnetic layer that is formed in a position farthest from the electromagnetic-wave incident side among the magnetic layers constituting the electromagnetic-wave absorbing layer 1. Further, instead of the metal plate, the reflective layer 2 may be a metal foil. The reflective layer 2 also may be a metal-deposited film formed on the surface of the magnetic layer in a position farthest from the electromagnetic-wave incident side, or a metal-deposited film formed on a surface, on the electromagnetic-wave absorbing layer 1 side, of a nonmetal sheet or a plate-like member that is disposed on the surface of the magnetic layer in a position farthest from the electromagnetic-wave incident side.

The kind of the metal constituting the reflective layer 2 is not particularly limited, and various kinds of metal materials, including metal materials generally used for electronic components such as aluminum, copper and chromium can be used. It is more preferred that the metal material to be used is a metal with a minimum electrical resistance and a high corrosion resistance.

In the electromagnetic-wave absorbing sheet of this embodiment, the reflective layer 2 provided on the back surface of the electromagnetic-wave absorbing layer 1 can reliably avoid penetration of electromagnetic waves through the electromagnetic-wave absorbing sheet. In particular, it is possible to provide an electromagnetic-wave absorbing sheet that prevents the leakage of electromagnetic waves to be emitted to the outside from electric circuit components driven at high frequencies.

Other than the above usage for reliably preventing the transmission of electromagnetic waves by forming the reflective layer 2 on the back surface of the electromagnetic-wave absorbing layer 1, the electromagnetic-wave absorbing sheet can be used also as, e.g., an isolator that is designed to attenuate electromagnetic waves while allowing penetration of part of electromagnetic waves. Including these usages, it is not essential to provide the reflective layer 2 made of a metal film on the back surface side of the electromagnetic-wave absorbing layer 1 in the electromagnetic-wave absorbing sheet of this embodiment.

[Base Film, Adhesive Layer]

In the electromagnetic-wave absorbing sheet of this embodiment, the stack of the electromagnetic-wave absorbing layer 1 and the reflective layer 2 is formed on the base film 3 as illustrated in FIG. 1.

As described above, it is possible to impart higher electromagnetic-wave absorbing properties to the electromagnetic-wave absorbing sheet of this embodiment by adjusting the thickness of the magnetic layers constituting the electromagnetic-wave absorbing layer 1. Because of this, in some cases, the thickness of the electromagnetic-wave absorbing layer 1 cannot be determined only from the viewpoint of the strength and handleability as the electromagnetic-wave absorbing sheet. In case an electromagnetic-wave absorbing sheet that includes the reflective layer 2 on the electromagnetic-wave absorbing layer 1 is thin as a whole and cannot have a predetermined strength, it is preferable to stack the base film 3 (resin base) on the back surface side of the reflective layer 2 as illustrated in FIG. 1.

The base film 3 may be formed using various resin films such as a PET film, rubbers, and paper materials such as Japanese paper. The material and the thickness of the base film 3 do not affect the electromagnetic-wave absorbing properties in the electromagnetic-wave absorbing sheet of this embodiment. Thus, it is possible to select a base film 3 that is made from an appropriate material and that has an appropriate thickness from the viewpoint of the practical use (e.g., strength, handleability) of the electromagnetic-wave absorbing sheet.

Moreover, the electromagnetic-wave absorbing sheet of this embodiment illustrated in FIG. 1 includes the adhesive layer 4 on the surface of the base film 3 on a side opposite to a side where the electromagnetic-wave absorbing layer 1 is formed.

By providing the adhesive layer 4, it is possible to attach the stack of the reflective layer 2 and the electromagnetic-wave absorbing layer 1 disposed on the base film 3 to a desired position, including an inner surface of a housing that contains an electric circuit and an inner surface or outer surface of an electric device. Specifically, since the electromagnetic-wave absorbing layer 1 of the electromagnetic-wave absorbing sheet of this embodiment has flexibility, it can be attached easily even on a curved surface (bent surface). Thus, the adhesive layer 4 improves the handleability of the electromagnetic-wave absorbing sheet.

The adhesive layer 4 may be formed using a known material utilized as an adhesive layer such as an adhesive tape, including an acrylic-based adhesive, a rubber-based adhesive, and a silicone-based adhesive. A tackifier or crosslinking agent may be used to adjust the tackiness with respect to an adherend and reduce adhesive residues. The tackiness with respect to an adherend is preferably 5 N/10 mm to 12 N/10 mm. When the tackiness is less than 5 N/10 mm, the electromagnetic-wave absorbing sheet may be easily peeled off from an adherend or displaced. When the tackiness is larger than 12 N/10 mm, the electromagnetic-wave absorbing sheet is difficult to be peeled off from an adherend.

The thickness of the adhesive layer 4 is preferably 20 μm to 100 μm. When the adhesive layer 4 is thinner than 20 μm, the tackiness is low and the electromagnetic-wave absorbing sheet may be easily peeled off from an adherend or displaced. When the adhesive layer 4 is thicker than 100 μm, the electromagnetic-wave absorbing sheet is difficult to be peeled off from an adherend. If cohesion of the adhesive layer 4 is low, an adhesive may remain on an adherend when the electromagnetic-wave absorbing sheet is peeled off from the adherend.

The adhesive layer in the present specification may be an adhesive layer for unpeelable attachment, or an adhesive layer for peelable attachment.

Needless to say, it is not essential for the electromagnetic-wave absorbing sheet to include the adhesive layer 4 for attachment of the electromagnetic-wave absorbing sheet to a predetermined surface. Instead, the surface of a member on which the electromagnetic-wave absorbing sheet is to be disposed may have tackiness, or a double-sided tape or an adhesive may be used to attach the electromagnetic-wave absorbing sheet to a predetermined part. In this regard, the adhesive layer 4 is not an essential component in the electromagnetic-wave absorbing sheet of this embodiment.

Moreover, although the electromagnetic-wave absorbing sheet of this embodiment may be a sheet made up of the electromagnetic-wave absorbing layer 1 alone or a sheet made up of the stack of the electromagnetic-wave absorbing layer 1 and the reflective layer 2, an adhesive layer may be provided in these electromagnetic-wave absorbing sheets.

[Impedance Matching]

The electromagnetic-wave absorbing sheet of this embodiment absorbs electromagnetic waves of high frequencies between several tens of GHz and several hundreds GHz (called millimeter-wave band), and frequencies up to three THz. In the electromagnetic-wave absorber that absorbs electromagnetic waves of high frequencies, the impedance of the magnetic layers (electromagnetic-wave absorbing layer) largely affects the properties of the electromagnetic-wave absorber. When the impedance is not matched, i.e., there is a large impedance difference between two layers present continuously in the entrance direction of electromagnetic waves, electromagnetic waves are reflected or scattered at an interface between the magnetic layers upon entrance of electromagnetic waves to the next magnetic layer across the boundary. In a situation where electromagnetic waves do not enter the magnetic layers, it is impossible to satisfactory perform electromagnetic-wave absorption by the magnetic resonance of the magnetic iron oxides contained in the respective magnetic layers. In view of this, in the electromagnetic-wave absorbing sheet of this embodiment, the impedance should be matched when electromagnetic waves enter, from the air, the magnetic layer that is disposed on the surface of the electromagnetic-wave absorbing layer on the electromagnetic-wave incident side and when electromagnetic waves sequentially enter the stacked magnetic layers.

The following describes the impedance matching.

First, in the simplest case, the electromagnetic-wave absorbing layer is formed of one magnetic layer. The concept of impedance matching of this case will be described below.

Figure 4:
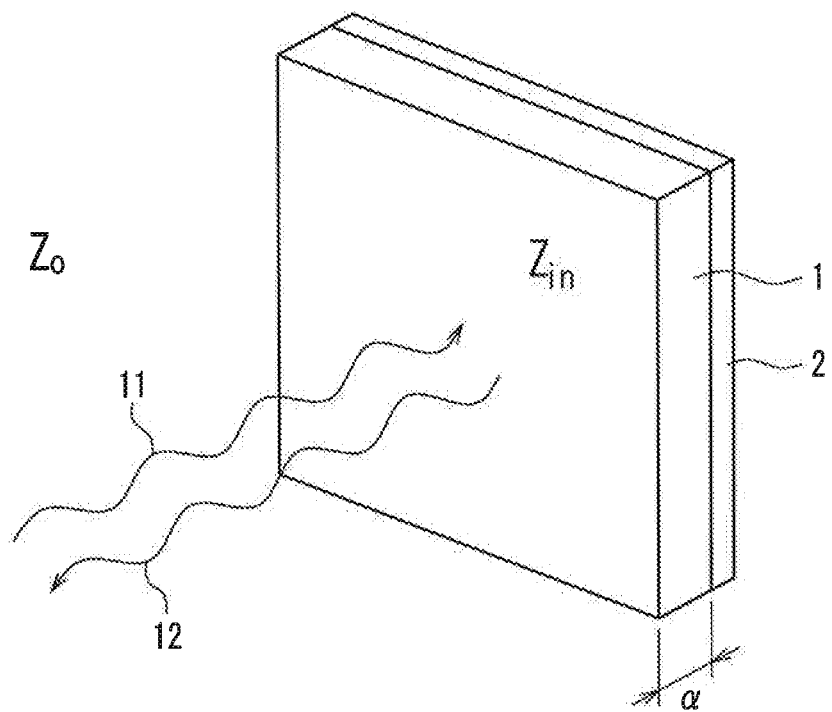
FIG. 4 is a view illustrating impedance matching in the electromagnetic-wave absorber of this embodiment.

FIG. 4 is a view illustrating the impedance matching of the electromagnetic-wave absorbing layer.

An electromagnetic-wave absorbing sheet illustrated in FIG. 4 includes the reflective layer 2 on the back surface of the electromagnetic-wave absorbing layer 1. The electromagnetic-wave absorbing sheet configured to include the reflective layer 2 on the back surface enables easy measurement of the electromagnetic-wave absorbing properties of the electromagnetic-wave absorbing sheet because electromagnetic waves that are not absorbed by the electromagnetic-wave absorbing layer 1 are reflected by the reflective layer and emitted to the front side (electromagnetic-wave incident side). In the consideration of the impedance matching, the reflective layer 2 is not an essential configuration. Further, although the electromagnetic-wave absorbing sheet of this embodiment includes the base film 3 and the adhesive layer 4 on the back surface side of the reflective layer 2 as illustrated in FIG. 1, the base film 3 and the adhesive layer 4 are irrelevant in the consideration of the impedance matching and thus are not illustrated in FIG. 4.

As illustrated in FIG. 4, electromagnetic waves 11 to be absorbed by the electromagnetic-wave absorbing sheet propagate through the air and enter the electromagnetic-wave absorbing layer 1. Electromagnetic waves incident upon the electromagnetic-wave absorbing layer 1 are absorbed by the magnetic resonance of epsilon iron oxide, which is the electromagnetic-wave absorbing material in the electromagnetic-wave absorbing layer 1 not illustrated in FIG. 4. The electromagnetic waves greatly attenuated are reflected by the reflective layer 2 on the back surface and emitted forward as reflected waves 12. By measuring the intensity of the reflected waves 12 and comparing the measured intensity with the intensity of the incident electromagnetic waves 11, it is possible to comprehend the degree of electromagnetic-wave absorption in the electromagnetic-wave absorbing sheet.

Here, an impedance $Z_{in}$ of the electromagnetic-wave absorbing layer 1 of the electromagnetic-wave absorbing sheet is expressed by Formula (2) below.

[Numerical Formula 1]

$$Z_{in} = Z_0 \sqrt{\frac{\mu_r}{\varepsilon_r}} \tanh\left(i\frac{2\pi d}{\lambda}\sqrt{\varepsilon_r \mu_r}\right) \qquad (2)$$

In Formula (2) above, $Z_0$ is an impedance value in a vacuum state and is about 377Ω, which is almost equal to the impedance in the air. By making $Z_{in}$ equal to $Z_0$, the impedance between in the air and the electromagnetic-wave absorbing layer 1 is matched, so that electromagnetic waves propagating through the air can enter the electromagnetic-wave absorbing layer 1 directly without being reflected or scattered on the surface of the electromagnetic-wave absorbing layer 1 of the electromagnetic-wave absorbing sheet. Thus, it is possible to maximize the electromagnetic-wave absorbing properties possessed by the electromagnetic-wave absorbing layer 1.

The above indicates that, in order to make $Z_{in}$ equal to $Z_0$ in Formula (2), if the wavelength λ of electromagnetic waves is determined, the thickness d of the electromagnetic-wave absorbing layer 1 is determined to a predetermined value. In other words, when the frequency of electromagnetic waves to be absorbed by the electromagnetic-wave absorbing layer 1 is determined, an optimum thickness d as the electromagnetic-wave absorbing layer 1 is determined.

The electromagnetic-wave absorbing properties obtained by performing the impedance matching can be measured in accordance with a free space method using electromagnetic-wave absorbing sheets.

Figure 5:
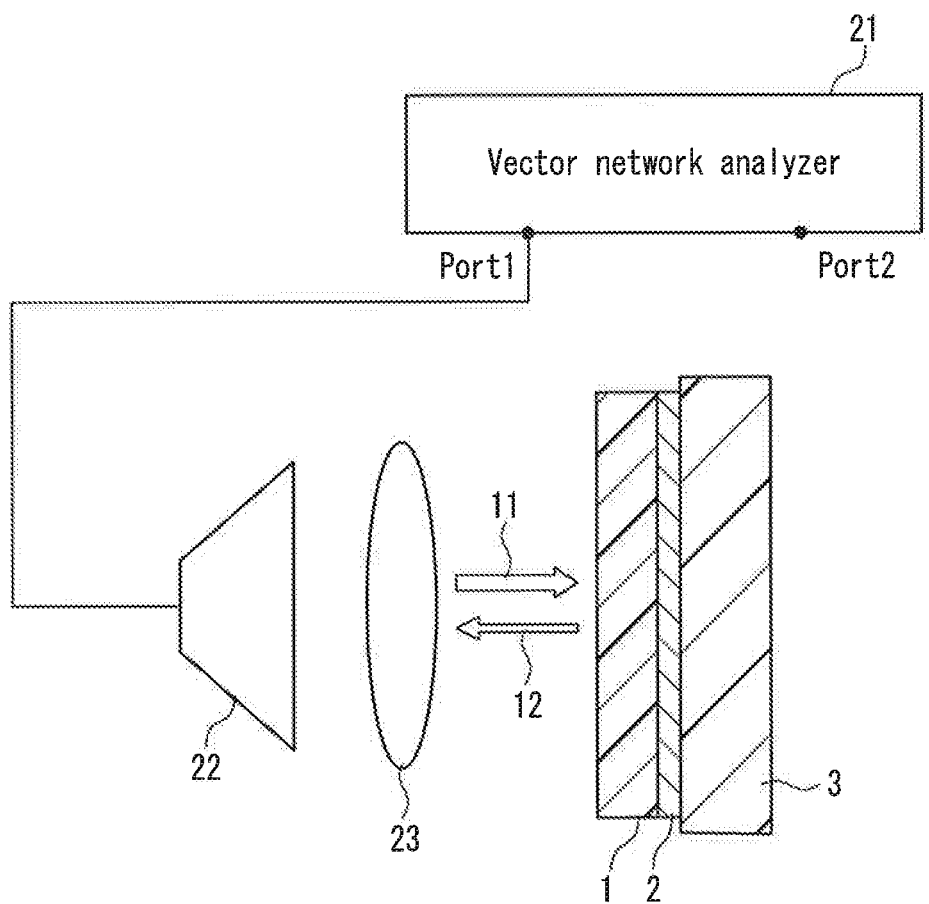
FIG. 5 is a model view illustrating a free space method for measuring the electromagnetic-wave absorbing properties of the electromagnetic-wave absorber.

FIG. 5 schematically illustrates a measurement state based on the free space method.

As illustrated in FIG. 5, an electromagnetic-wave absorbing sheet including the electromagnetic-wave absorbing layer 1 and the reflective layer 2 on the back surface of the electromagnetic-wave absorbing layer 1 is prepared as a sheet to be measured. Using one of the ports of a millimeter-wave network analyzer, the electromagnetic-wave absorbing sheet is irradiated with input waves 11 (millimeter-waves) having a predetermined frequency from a transmission-reception antenna 22 via a dielectric lens 23, and reflected waves 12 from the electromagnetic-wave absorbing sheet is measured.

The intensity of the input waves 11 is compared with the obtained intensity of the reflected waves 12 to determine a reflection loss (RL) in dB, which is a degree of attenuation. RL can be calculated by Formula (3) below.

[Numerical Formula 2]

$$RL = 20\log_{10}\left|\frac{Z_{in} - Z_0}{Z_{in} + Z_0}\right| \qquad (3)$$

If the degree of attenuation of the reflected waves 12 obtained above is 15 dB for example, it can be considered that 99% of the input waves 11 is absorbed by the electromagnetic-wave absorbing sheet, i.e., the reflected waves 12 are attenuated to 1%, and the electromagnetic-wave absorbing properties are satisfactory In this manner, by selecting the thickness d of the magnetic layer in accordance with the frequency of electromagnetic waves to be absorbed upon entrance of electromagnetic waves from the air into the electromagnetic-wave absorbing layer 1 in order to match the input impedance $Z_{in}$ to the impedance $Z_0$ of the air, it is possible to obtain still higher electromagnetic-wave absorbing properties.

[Stack of Magnetic Layers]

As explained with reference to FIG. 4, when electromagnetic waves travel at a boundary between members having different impedances, they are scattered at the boundary if impedance matching is unsatisfactory. Such undesired reflection of electromagnetic waves lowers the electromagnetic-wave absorbing properties in the electromagnetic-wave absorbing sheet. This phenomenon occurs not only when electromagnetic waves enter the electromagnetic-wave absorbing layer from a vacuum (in the air) as illustrated in FIG. 4, but also occurs at the boundaries between the magnetic layers when the electromagnetic-wave absorbing layer is a stack of a plurality of the magnetic layers. In the case of the electromagnetic-wave absorbing layer of this embodiment in which the five magnetic layers are stacked for example, it is preferable to match the impedance between the magnetic layers as well as match the impedance of the magnetic layer disposed on the uppermost surface on the electromagnetic-wave incident side to the impedance in the air.

The following describes the simulation analysis of the electromagnetic-wave absorbing properties in the electromagnetic-wave absorber of this embodiment, in which the electromagnetic-wave absorbing layer is formed as a stack of the five magnetic layers.

First, the permeability in the magnetic iron oxide that causes gyromagnetic resonance with respect to the frequency of incident electromagnetic waves is calculated using the LLG (Landau-Lifshitz-Gilbert) equation expressed as Formulae (4) and (5) below.

[Numerical Formula 3]

$$\mu'r = 1 + \frac{\omega_s^2 X_{S0} \times [(\omega_s^2 - \omega^2) + \omega^2 * a^2]}{[\omega_s^2 - \omega^2 * (1 + a^2)]^2 + 4 * \omega^2 * \omega_s^2 * a^2} \qquad (4)$$

-continued $$\mu''r = \frac{X_{S0} * \omega_S * \omega * a * [\omega_s^2 + \omega^2 * (1+a^2)]}{[\omega_s^2 - \omega^2 * (1+a^2)]^2 + 4 * \omega^2 * \omega_s^2 * a^2} \quad (5)$$

In Formulae (4) and (5) above, $X_{s0}$ is a direct current susceptibility, $\omega_s$ is a gyromagnetic resonance angular frequency ($2\pi f_r$), and a is a damping constant. The results obtained by substituting the characteristic values of epsilon iron oxide in these formulae are indicated in FIG. 6.

Figure 6A:
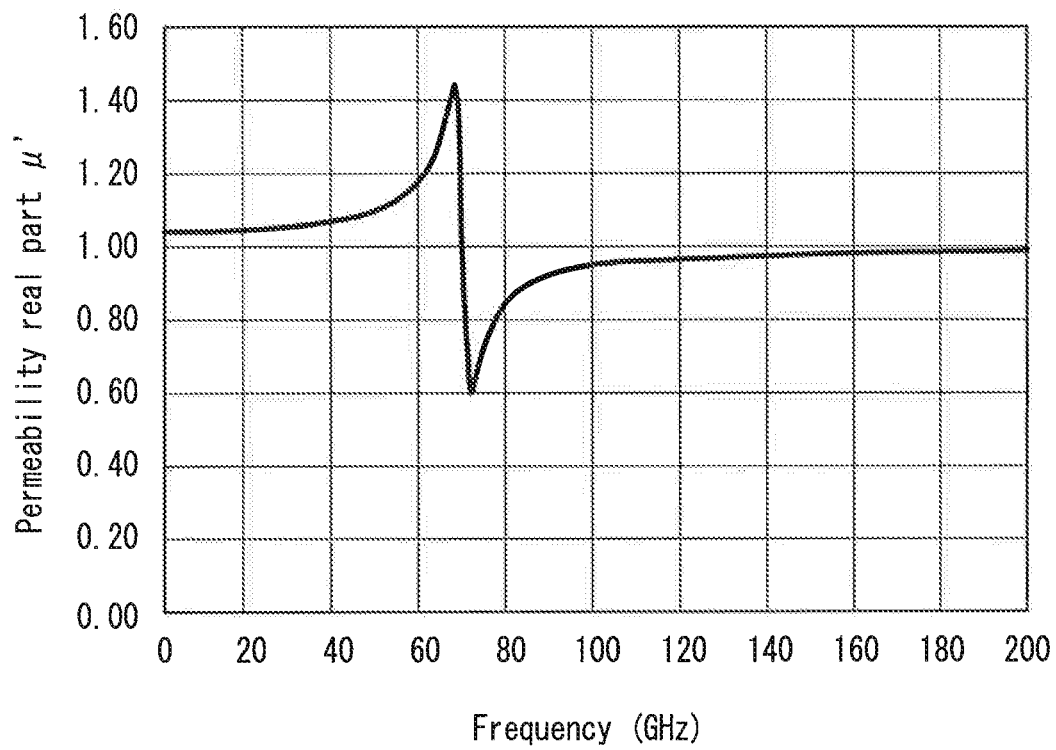
FIG. 6A shows the frequency characteristic of a permeability real part.
Figure 6B:
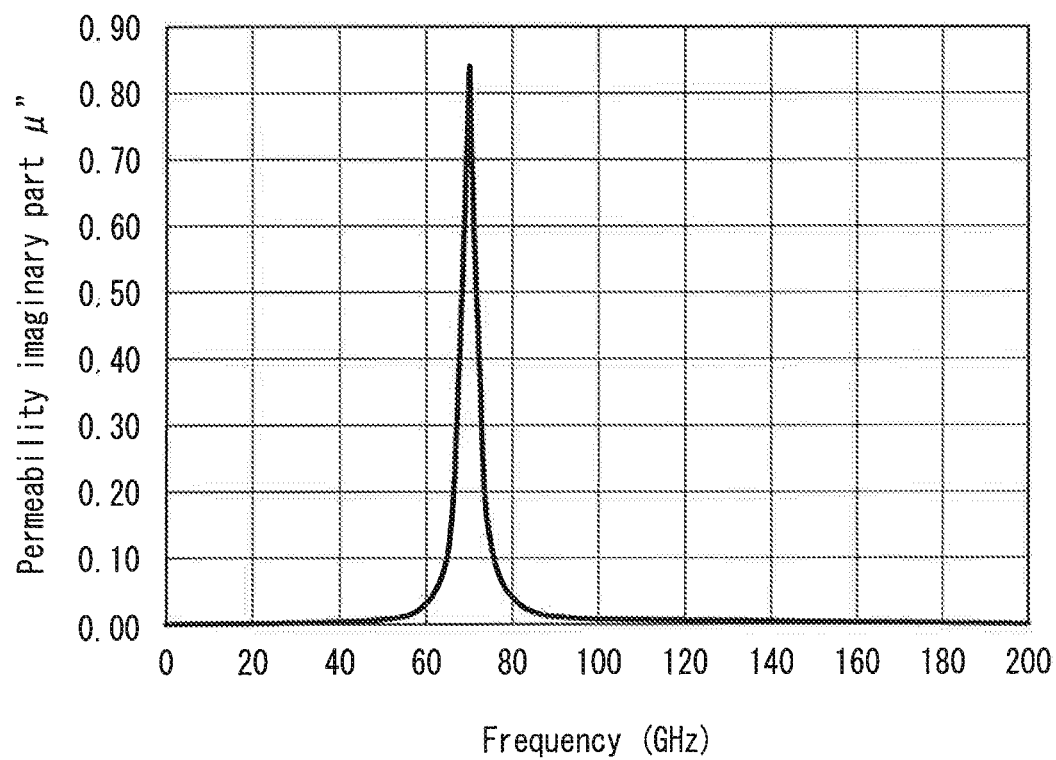
FIG. 6B shows the frequency characteristic of a permeability imaginary part.

FIG. 6A shows the frequency characteristic of a permeability real part (μ') calculated from Formula (4), and FIG. 6B shows the frequency characteristic of a permeability imaginary part (μ") calculated from Formula (5).

As indicated in FIG. 6, the epsilon iron oxide used in the simulation has a peak of the permeability imaginary part (μ") at 70 GHz and thus absorbs electromagnetic waves having a wavelength of 70 GHz.

Next, corresponding to the fact that the electromagnetic-wave absorber of this embodiment is an electromagnetic-wave absorbing sheet in which the magnetic iron oxide particles are dispersed in the resin binder, the volume contents of the magnetic iron oxides in the respective magnetic layers are calculated. For example, the magnetic layers that are obtained by preparing a magnetic coating material by mixing and kneading fine epsilon iron oxide particles, a binder material and a dispersant, and applying the magnetic coating material, followed by drying and calendering as described above, contain the resin material, and the sheet-like magnetic layers actually formed by the application of the magnetic coating material include voids. Because of this, it is necessary to perform simulation by calculating the volume contents of the magnetic material in the layers.

Figure 7:
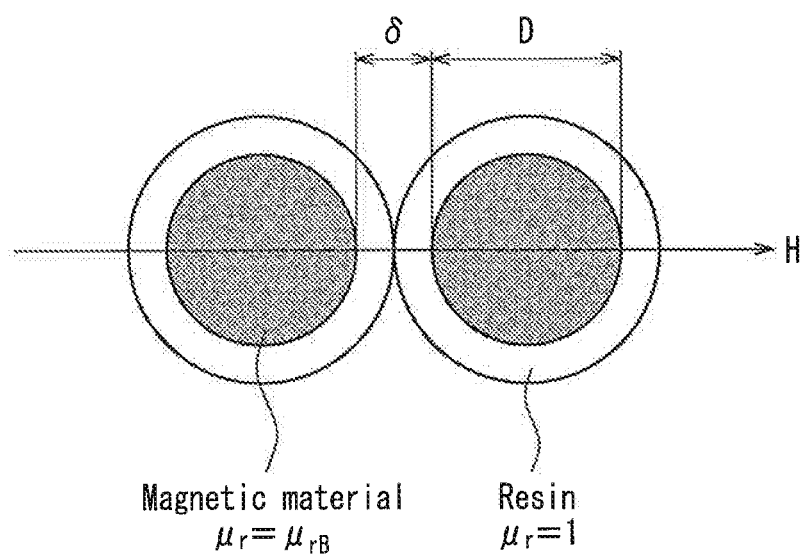
FIG. 7 is a view illustrating a magnetic particle model used in the simulation for calculating the change in permeability according to the volume content of magnetic iron oxide.

FIG. 7 illustrates a model used in the simulation for calculating the permeability of the magnetic iron oxide in view of the volume content.

In the simulation, calculations were carried out on the assumption that, as illustrated in FIG. 7, the particulate magnetic material and the resin binder have a configuration in which the magnetic powder (permeability $\mu_r = \mu_{rB}$) having a diameter of D is surrounded by the resin layer (permeability $\mu_r = 1$) having a thickness of δ/2.

The permeability $\mu_r$ of the electromagnetic-wave absorbing layer as a whole can be expressed by Formula (6) below.

Here, since the permeability of the magnetic powder can be expressed as Formula (7) below from the permeability real part and the permeability imaginary part, it can be expressed as Formula (8) by substituting Formula (7) into Formula (6).

[Numerical Formulae 4]

$$\mu_r = \frac{\mu_{rB}\left(1 + \frac{\delta}{D}\right)}{1 + \mu_{rB}\frac{\delta}{D}} \quad (6)$$

$$\mu_{rB} = \mu' + i\mu'' \quad (7)$$

$$\mu_r = \mu'_B + i\mu''_B \quad (8)$$

From Formula (8) above, the combined input impedance of the electromagnetic-wave absorbing layer of this embodiment, in which the five magnetic layers are stacked, can be expressed by Formula (9) below.

[Numerical Formula 5]

$$\begin{pmatrix} E_6 \\ H_6 \end{pmatrix} = \begin{pmatrix} \cosh y_5 d_5 & Z_5 \sinh y_5 d_5 \\ \frac{1}{Z_5}\sinh y_5 d_5 & \cosh y_5 d_5 \end{pmatrix} \quad (9)$$

$$\begin{pmatrix} \cosh y_4 d_4 & Z_4 \sinh y_4 d_4 \\ \frac{1}{Z_4}\sinh y_4 d_4 & \cosh y_4 d_4 \end{pmatrix} \begin{pmatrix} \cosh y_3 d_3 & Z_3 \sinh y_3 d_3 \\ \frac{1}{Z_3}\sinh y_3 d_3 & \cosh y_3 d_3 \end{pmatrix}$$

$$\begin{pmatrix} \cosh y_2 d_2 & Z_2 \sinh y_2 d_2 \\ \frac{1}{Z_2}\sinh y_2 d_2 & \cosh y_2 d_2 \end{pmatrix} \begin{pmatrix} \cosh y_1 d_1 & Z_1 \sinh y_1 d_1 \\ \frac{1}{Z_1}\sinh y_1 d_1 & \cosh y_1 d_1 \end{pmatrix} \begin{pmatrix} O \\ H_1 \end{pmatrix}$$

Here, $Z_N$ is an impedance of a material of the N-th layer, $\gamma_N$ is a propagation constant of the material of the N-th layer, $d_N$ is a thickness of the N-th layer, and $Z_0$ is an impedance in the air (vacuum).

Figure 8:
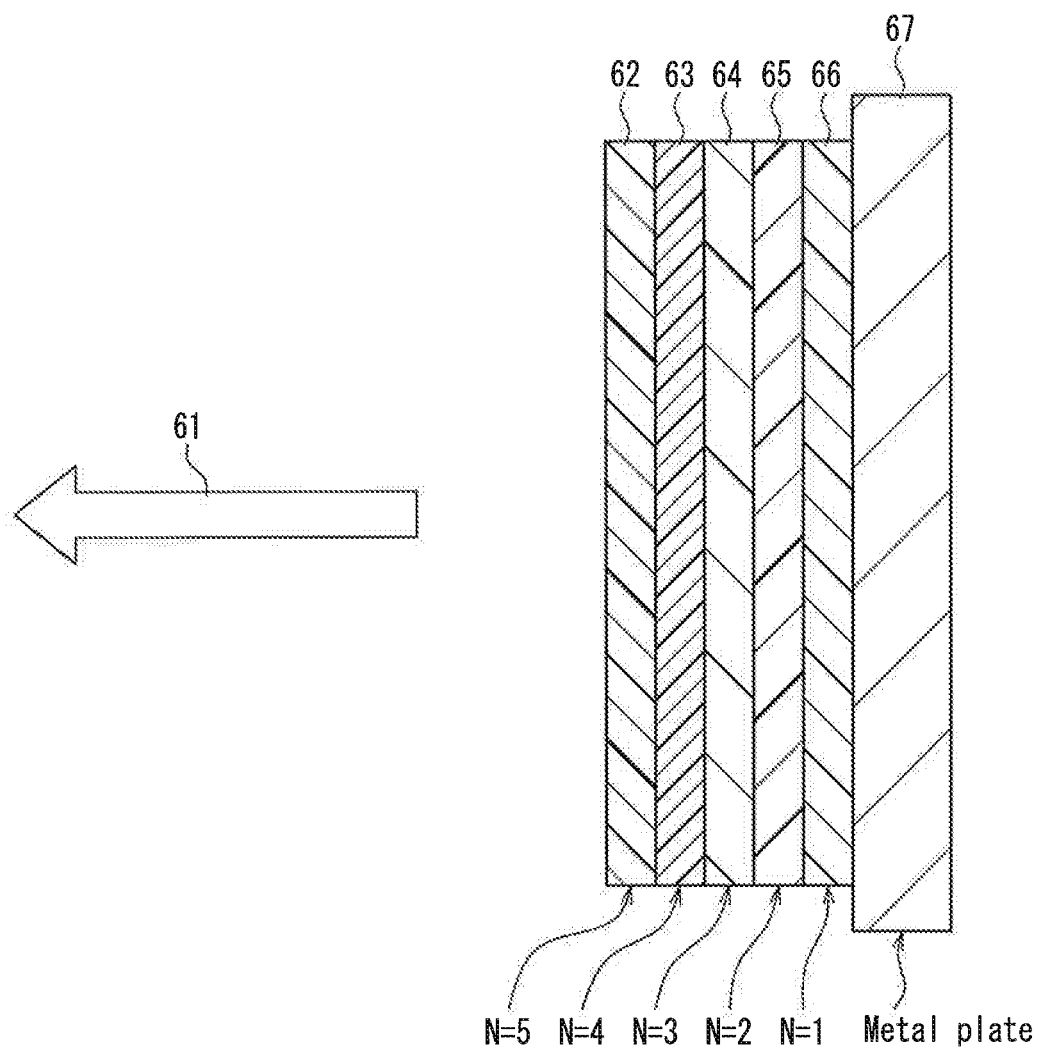
FIG. 8 is a view illustrating the electromagnetic-wave absorption and impedance matching in stacked magnetic layers in an electromagnetic-wave absorbing layer of the electromagnetic-wave absorber of this embodiment.

As illustrated in FIG. 8, the model of Formula (9) is a reflection-type electromagnetic-wave absorbing sheet in which a reflective layer 67 made of a metal plate is disposed on the back surface of an electromagnetic-wave absorbing layer constituted by a stack of five magnetic layers 62, 63, 64, 65 and 66. The first magnetic layer 66 (N=1), the second magnetic layer 65 (N=2), the third magnetic layer 64 (N=3), the fourth magnetic layer 63 (N=4), and the fifth magnetic layer 62 (N=5) are stacked sequentially from the side of the reflective layer 67 that reflects electromagnetic waves.

Further, in Formula (9), since the conductivity of the metal plate 67 is infinite (resistance 0), the electric field and the magnetic field can be expressed as (0, $H_1$), and the electric field and the magnetic field of reflected waves 61 emitted after passing through the stack of the five magnetic layers (electromagnetic-wave absorbing layer) are expressed as ($E_6$, $H_6$).

The following describes the combined electromagnetic-wave absorption by the five magnetic layers in view of the reflection attenuation rate "Γ". The attenuation rate RL (Reflection Loss) when electromagnetic waves are absorbed by the stack of the five magnetic layers (electromagnetic-wave absorbing layer) can be expressed by Formula (10) using the reflection attenuation rate "Γ".

[Numerical Formula 6]

$$RL(\text{dB}) = 20 * \log_{10}\left(\frac{1}{\Gamma}\right) \quad (10)$$

Here, as described above, the impedance matching in the respective magnetic layers is important.

By setting each of the five magnetic layers from N=1 to N=5 (electromagnetic-wave absorbing layer) in FIG. 8 to satisfy the condition of Formula (11) below, it is possible to make the impedance $Z_n$ of the N-th layer equal to the impedance $Z_0$ in the air, as expressed by Formula (12).

[Numerical Formulæ 7]

$$\sqrt{\frac{\mu_n}{\varepsilon_n}} \tanh\left(i\frac{2\pi d_n}{\lambda_n}\sqrt{\mu_n \varepsilon_n}\right) = 1 \quad (11)$$

$$Z_n = Z_0 \sqrt{\frac{\mu_n}{\varepsilon_n}} \tanh\left(i\frac{2\pi d_n}{\lambda_n}\sqrt{\mu_n \varepsilon_n}\right) \quad (12)$$

Figure 9:
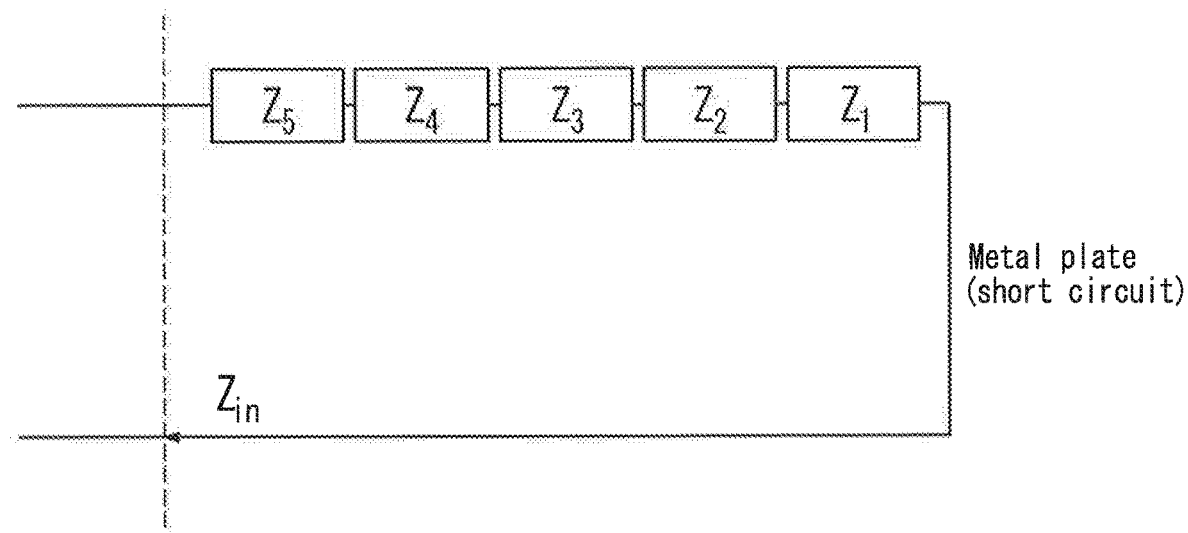
FIG. 9 is an equivalent circuit diagram of the stacked magnetic layers in the electromagnetic-wave absorbing layer of the electromagnetic-wave absorber of this embodiment.

FIG. 9 is an equivalent circuit of the combined impedance in the model illustrated in FIG. 8.

As illustrated in FIG. 9, a sum of impedances $Z_1$, $Z_2$, $Z_3$, $Z_4$ and $Z_5$ of the magnetic layers is a combined impedance $Z_{in}$ of the electromagnetic-wave absorbing sheet. If the imaginary part of the reflection attenuation rate $\Gamma$ in the electromagnetic-wave absorbing sheet becomes 0, the combined impedance $Z_{in}$ becomes equal to the impedance $Z_0$ in the air.

Figure 10:
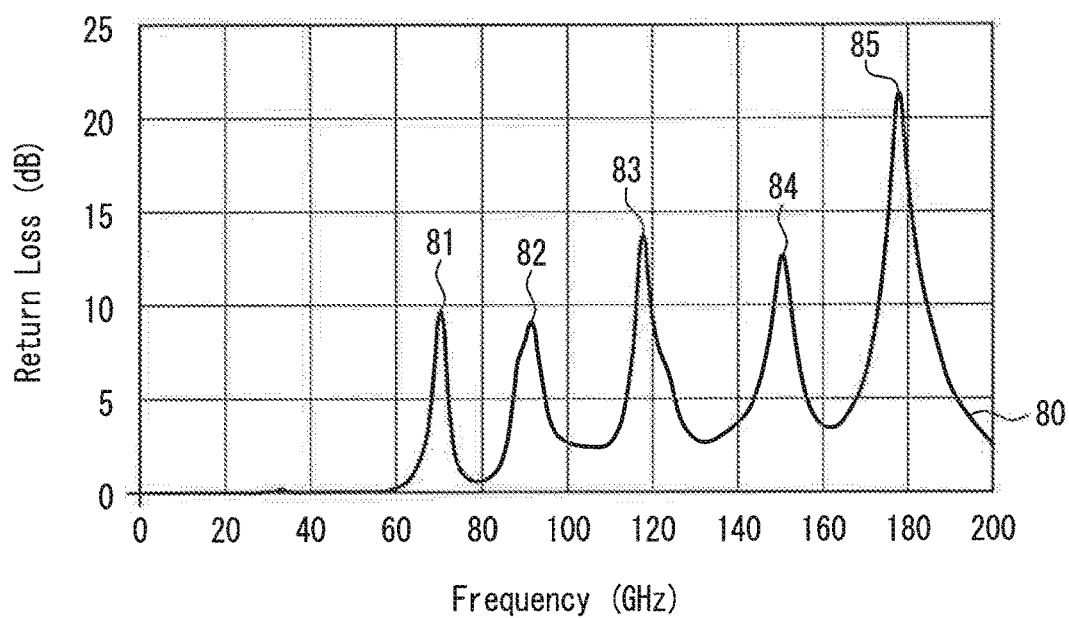
FIG. 10 shows simulation results concerning the electromagnetic-wave absorbing properties in the electromagnetic-wave absorber of this embodiment.

FIG. 10 shows the simulation results of the electromagnetic-wave absorbing properties obtained by the electromagnetic-wave absorber in which the impedances of the five magnetic layers are matched by satisfying the requirement of Formula (11).

In FIG. 10, the model illustrated in FIG. 8 was used, and from the reflective layer 67 side, the resonance frequency of the first magnetic layer 66 (N=1) was set at 180 GHz, the resonance frequency of the second magnetic layer 65 (N=2) was set at 150 GHz, the resonance frequency of the third magnetic layer 64 (N=3) was set at 120 GHz, the resonance frequency of the fourth magnetic layer 63 (N=4) was set at 90 GHz, and the resonance frequency of the fifth magnetic layer 62 (N=5) was set at 70 GHz. The frequency characteristics of the permeability real part and permeability imaginary part illustrated in FIG. 6 are the frequency characteristics of the fifth magnetic layer 62. The damping constant of the respective layers was set at 0.03, and the direct current susceptibility of the respective layers was set at 0.05. In order to simplify the condition as the stack model of a plurality of the magnetic layers, the volume content of the magnetic material in the respective layers was assumed to be 100%.

Here, it is understood from Formula (1) that, since ν is a gyromagnetic constant and is a fixed value determined by the type of the magnetic iron oxide, there is a proportional relationship between the natural magnetic resonance frequency fr and the value of the anisotropic magnetic field ($H_A$). From this relationship, in this model, changing the natural magnetic resonance frequencies fr of the first layer to the fifth layer corresponds to changing the values of the anisotropic magnetic field $H_A$ in the respective layers.

The calculation was carried out to satisfy the condition of Formula (11) in order to match the impedances in the respective layers. The thickness d of the first magnetic layer 66 calculated was 856 μm, the thickness d of the second magnetic layer 65 was 211 μm, the thickness d of the third magnetic layer 64 was 317 μm, the thickness d of the fourth magnetic layer 63 was 351 μm, and the thickness d of the fifth magnetic layer 62 on the electromagnetic-wave incident side was 452 μm. Using these values, the frequency characteristic of electromagnetic waves was calculated as the reflection attenuation rate expressed by Formula (10).

FIG. 10 illustrates the frequency characteristic of the attenuation rate in the electromagnetic-wave absorber in which the five magnetic layers are stacked.

The result of the simulation indicated that, as illustrated in FIG. 10, a frequency characteristic 80 of the electromagnetic-wave absorber in which the five magnetic layers are stacked has absorption peaks at 70 GHz (reference numeral 81), 90 GHz (reference numeral 82), 118 GHz (reference numeral 83), 150.5 GHz (reference numeral 84), and 178 GHz (reference numeral 85) as the absorption peak frequencies of the respective layers. Further, since the impedances of the respective magnetic layers are matched, the respective absorption peaks are formed to exceed the attenuation rate of 10 dB, and thus the magnetic layers can favorably attenuate electromagnetic waves of the corresponding frequencies. Moreover, the respective attenuation peaks are sharply formed, and electromagnetic waves of intermediate frequencies that are not set as the attenuation frequencies pass through the layers favorably without being absorbed. Thus, by setting the value of the anisotropic magnetic field ($H_A$) of the magnetic iron oxide contained in at least one magnetic layer to be different from that of the magnetic iron oxide contained in another of the magnetic layers, and matching the impedances of the magnetic layers to be stacked, it is possible to form an electromagnetic-wave absorber having a property as a filter that allows electromagnetic waves having frequencies other than the predetermined frequencies to pass therethrough.

Incidentally, the electromagnetic-wave absorber, whose electromagnetic-wave absorbing properties are illustrated in FIG. 10, is an ideal state in which the impedances of the magnetic layers are matched. However, in actuality, it is difficult to precisely match the impedances of the respective magnetic layers. In this case, it is preferable to set the impedances of the respective layers to be gradually larger from the electromagnetic-wave incident side (the fifth magnetic layer 62 in FIG. 8) toward the first magnetic layer 66 located closest to the reflective layer 67 along the traveling direction of electromagnetic waves. The reason for this is that electromagnetic waves can enter the layer of a larger impedance relatively easily, whereas the entrance of electromagnetic waves is limited at a boundary where the impedance becomes smaller.

Further, it is preferred that the difference in the impedance between the adjacent magnetic layers is 350Ω or less (absolute value). When the difference in the impedance between two magnetic layers is greater than 350Ω (absolute value), electromagnetic waves are greatly scattered and reflected at the interface between the two magnetic layers.

In one example, the reflection attenuation rate was simulated under the following conditions: the thickness and impedance of the fourth magnetic layer 63 were 860 μm and 741.7Ω, respectively, the thickness and impedance of the fifth magnetic layer 62 were 452 μm and 376.7Ω, respectively, and the difference in the impedance between the adjacent magnetic layers (the fourth magnetic layer 63 and the fifth magnetic layer 62) was 365Ω. The reflection attenuation rate of the fourth magnetic layer 63 was resulted in 5.59 dB, which is smaller than 6 dB (½).

Meanwhile, the reflection attenuation rate was also simulated under the following conditions: the thickness and impedance of the fourth magnetic layer 63 were 850 μm and 701.6Ω, respectively, and the thickness and impedance of the fifth magnetic layer 62 were 452 μm and 376.7Ω, respectively, and the difference in the impedance between the adjacent magnetic layers (the fourth magnetic layer 63 and the fifth magnetic layer 62) was 325Ω. The reflectance of the fourth magnetic layer 63 was resulted in 6.10 dB, and the reflection attenuation rate of 50% or more could be obtained. As described above, when the difference in the impedance between the stacked magnetic layers is greater than 350Ω, the electromagnetic-wave absorbing properties are greatly lowered only due to the impedance mismatch, and it is impossible to obtain properties as an electromagnetic-wave absorber of absorbing electromagnetic waves of a plurality of frequencies.

Incidentally, the above value 350Ω is a value obtained from the simulation conducted under an extreme condition in which the reflection attenuation rate became lower than 50% due to the impedance mismatch, and hence the value does not directly indicate the tolerance range of impedance matching. It is considered that in the configuration of the electromagnetic-wave absorber that includes, as the electromagnetic-wave absorbing layer, the magnetic layers that can favorably absorb electromagnetic waves of their predetermined frequencies, the respective magnetic layers are required to achieve the absorption rate of at least 90% or more. In order to allow the respective magnetic layers to maintain the electromagnetic-wave absorption rate of 90% or more, i.e., the attenuation rate of greater than 15 dB, the difference in the impedance between the magnetic layers should be suppressed to about 25Ω (absolute value).

The above embodiment assumed the electromagnetic-wave absorber that can absorb five frequencies by providing the five magnetic layers in total each magnetic layer having a predetermined resonance frequency, in accordance with the model of FIG. 8. However, as described above, there are the following restrictions on the impedances of the respective magnetic layers: it is preferable to set the impedances of the respective layers to be gradually larger along the traveling direction of electromagnetic waves; and it is preferable to set the difference in the impedance (absolute value) between the two adjacent layers to be 350Ω or less. If a magnetic layer having a desired resonance frequency cannot have a certain level of thickness from the viewpoint of impedance matching, a magnetic layer having a predetermined resonance frequency can be formed by interposing a magnetic layer or a plurality of magnetic layers having a different resonance frequency.

With this configuration, it is possible to obtain an electromagnetic-wave absorber that has sufficiently high electromagnetic-wave absorbing properties (electromagnetic-wave absorption attenuation rate) of predetermined resonance frequencies while exhibiting high and sharp frequency characteristic peaks.

Embodiment 2

The following describes an electromagnetic-wave absorber according to Embodiment 2 of the present application.

The electromagnetic-wave absorber according to Embodiment 2 is different from the sheet-like electromagnetic-wave absorber according to Embodiment 1 in which the magnetic iron oxide particles are dispersed in the resin binder, in that the electromagnetic-wave absorber of Embodiment 2 is an electromagnetic-wave absorber (bulk) in which the electromagnetic-wave absorbing layer is densely filled with magnetic iron oxide particles.

Each of the magnetic layers constituting the electromagnetic-wave absorber in which magnetic iron oxide particles are densely filled can be formed by preparing a case that corresponds to the desired thickness of the magnetic layer determined from the viewpoint of a predetermined planar shape and impedance matching for example, and filling an opening of the case with magnetic iron oxide particles.

Therefore, the electromagnetic-wave absorbing layer may be configured by stacking the case directly, with the magnetic iron oxide particles being filled in the case. Further, the electromagnetic-wave absorbing layer also may be configured by forming a plurality of solidified magnetic layers by injecting, into cases, a coagulant for solidifying magnetic iron oxide particles filled in the cases, and stacking the respective magnetic layers taken out from the cases.

Moreover, the electromagnetic-wave absorbing layer also may be configured by melting magnetic iron oxide particles and resin, and stacking plate-like molded bodies obtained by extrusion molding using a die.

Similarly to the sheet-like electromagnetic-wave absorber according to Embodiment 1 described above, it is necessary for the respective magnetic layers formed as a bulk for use in the electromagnetic-wave absorber of this embodiment to, e.g., substitute a predetermined amount of Fe element of ε-iron oxide with aluminum or the like to make the respective magnetic layers have desired resonance frequencies, and to match the impedances of the respective magnetic layers.

As described above, in the electromagnetic-wave absorber disclosed in the present application, the electromagnetic-wave absorbing layer is formed as a stack of a plurality of the magnetic layers, and the value of the anisotropic magnetic field ($H_A$) of the magnetic iron oxide contained in at least one of the magnetic layers is different from that of the magnetic iron oxide contained in another of the magnetic layers. With this configuration, it is possible to obtain an electromagnetic-wave absorber having absorption peaks in a plurality of frequency bands.

Therefore, where a plurality of frequencies need to be absorbed under the use of a millimeter-wave radar whose frequency can be switched according to the detection conditions for example, it is possible to provide an electromagnetic-wave absorbing sheet in which unnecessary electromagnetic waves can be absorbed reliably by one electromagnetic-wave absorber.

In the above embodiment, epsilon iron oxide is used as the magnetic iron oxide contained in the magnetic layers. By using epsilon iron oxide as described above, it is possible to form an electromagnetic-wave absorber that absorbs electromagnetic waves of 30 GHz to 300 GHz (millimeter-wave band). Further, by using rhodium or the like as the metal material substituting for the Fe site, it is possible to obtain an electromagnetic-wave absorber that absorbs electromagnetic waves up to several terahertz, which is the highest frequency defined as electromagnetic-wave.

In the electromagnetic-wave absorber disclosed in the present application, the magnetic iron oxide used in the magnetic layers is not limited to epsilon iron oxide.

Hexagonal ferrite as a ferrite electromagnetic absorber exhibits electromagnetic-wave absorbing properties in the 76 GHz band, and strontium ferrite exhibits electromagnetic-wave absorbing properties in several tens of GHz band. By forming sheet-like magnetic layers using magnetic iron oxide particles other than epsilon iron oxide having electromagnetic-wave absorbing properties in the millimeter-wave band from 30 GHz to 300 GHz and a resin binder for example, and stacking the magnetic layers, it is possible to obtain an electromagnetic-wave absorbing sheet that absorbs electromagnetic waves of a plurality of frequencies in the millimeter-wave band.

For example, hexagonal ferrite particles have a larger particle diameter (about a dozen μm) than epsilon iron oxide particles exemplified in the above embodiment, and the shape of the hexagonal ferrite particles is not substantially spherical but plate or needle crystal. Because of this, in the formation of the magnetic coating material using a resin binder, it is preferable to adjust the use of the dispersant and the kneading conditions with the binder so that, when the magnetic coating material is applied, the magnetic iron oxide powder is dispersed as uniformly as possible in the magnetic layers and the percentage of voids is as low as possible.

The above embodiment describes the electromagnetic-wave absorbing sheet that includes the electromagnetic-wave absorbing layer in which the five magnetic layers are stacked. However, the number of the magnetic layers of the electromagnetic-wave absorbing layer is not limited. As described above, since the frequency ranges of electromagnetic waves to be absorbed by the respective magnetic layers are limited, it is preferable to determine the number of the magnetic layers constituting the electromagnetic-wave absorbing layer so as to correspond to the number of the frequency bands of electromagnetic waves to be absorbed.

INDUSTRIAL APPLICABILITY

The electromagnetic-wave absorber disclosed in the present application is useful as an electromagnetic-wave absorber that absorbs electromagnetic waves of two or more frequencies in a high frequency band equal to or higher than the millimeter-wave band.

DESCRIPTION OF REFERENCE NUMERALS

1 Electromagnetic-wave absorbing layer
1a-1e Magnetic layer
$1a_1$, $1b_1$ Magnetic iron oxide particle
$1a_2$, $1b_2$ Resin binder
2 Reflective layer
3 Base film
4 Adhesive layer

The invention claimed is:

1. An electromagnetic-wave absorber comprising an electromagnetic-wave absorbing layer in which a plurality of magnetic layers are stacked, each magnetic layer containing magnetic iron oxide that magnetically resonates at a high frequency in a band equal to or higher than a millimeter-wave band,
   wherein in each of the magnetic layers, the magnetic iron oxide in a particulate form is dispersed in a resin binder, and
   a value of an anisotropic magnetic field ($H_A$) of the magnetic iron oxide contained in at least one of the magnetic layers is different from that of the magnetic iron oxide contained in another of the magnetic layers.

2. The electromagnetic-wave absorber according to claim 1, wherein a frequency characteristic of electromagnetic waves to be absorbed by the electromagnetic-wave absorber has a plurality of peaks, and the number of the peaks of the frequency characteristic is equal to the number of the magnetic layers stacked.

3. The electromagnetic-wave absorber according to claim 1, wherein an input impedance between the adjacent magnetic layers is matched, and
   an input impedance of the magnetic layer disposed on an uppermost surface on an electromagnetic-wave incident side is matched to an impedance in the air.

4. The electromagnetic-wave absorber according to claim 1, wherein the input impedance of the magnetic layers gradually increases from the electromagnetic-wave incident side along a traveling direction of electromagnetic waves.

5. The electromagnetic-wave absorber according to claim 1, wherein the electromagnetic-wave absorber is formed into a sheet having flexibility.

6. The electromagnetic-wave absorber according to claim 1, wherein the magnetic iron oxide is epsilon iron oxide.

7. The electromagnetic-wave absorber according to claim 1, wherein a reflective layer made of at least one of a metal plate, a metal foil or a metal-deposited film, is stacked on a surface of the electromagnetic-wave absorbing layer that is not on the electromagnetic-wave incident side.

8. The electromagnetic-wave absorber according to claim 7,
   wherein the reflective layer and the electromagnetic-wave absorbing layer are stacked sequentially on a resin base, and
   an adhesive layer is formed on a surface of the resin base on a side opposite to a side where the electromagnetic-wave absorbing layer is disposed.

* * * * *